(12) United States Patent
Puri et al.

(10) Patent No.: US 8,104,014 B2
(45) Date of Patent: Jan. 24, 2012

(54) REGULAR LOCAL CLOCK BUFFER PLACEMENT AND LATCH CLUSTERING BY ITERATIVE OPTIMIZATION

(75) Inventors: Ruchir Puri, Baldwin Place, NY (US); Haifeng Qian, White Plains, NY (US); Chin Ngai Sze, Austin, TX (US); James Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 12/022,951

(22) Filed: Jan. 30, 2008

(65) Prior Publication Data
US 2009/0193377 A1 Jul. 30, 2009

(51) Int. Cl.
*G06F 17/50* (2006.01)
(52) U.S. Cl. .......................... 716/134; 716/100
(58) Field of Classification Search .................. 716/1, 9, 716/100, 134
See application file for complete search history.

(56) References Cited

U.S. PATENT DOCUMENTS

| | | | |
|---|---|---|---|
| 6,266,803 B1 | 7/2001 | Sherer et al. | |
| 6,311,313 B1 | 10/2001 | Camporese et al. | |
| 6,732,343 B2 | 5/2004 | Frerichs et al. | |
| 6,857,107 B2 * | 2/2005 | Nagasaka et al. | 716/113 |
| 6,941,533 B2 | 9/2005 | Andreev et al. | |
| 7,117,470 B1 | 10/2006 | Tieg et al. | |
| 7,225,421 B2 | 5/2007 | Migatz et al. | |
| 2002/0095647 A1 | 7/2002 | Bernstein et al. | |
| 2002/0114224 A1 * | 8/2002 | Sasaki et al. | 368/113 |
| 2004/0196081 A1 * | 10/2004 | Srinivasan et al. | 327/165 |
| 2006/0031699 A1 | 2/2006 | Arthanari et al. | |
| 2008/0086711 A1 * | 4/2008 | Ito | 716/12 |
| 2008/0148203 A1 * | 6/2008 | Alpert et al. | 716/6 |

OTHER PUBLICATIONS

J. Max, "Quantizing for minimum distortion," *IEEE Trans. on Information Theory*, pp. 7-12, Mar. 1960.
R. Gray et al., "Quantization," *IEEE Trans. on Information Theory*, v. 44, n. 6, pp. 2325-2383 (1998).

* cited by examiner

*Primary Examiner* — Suchin Parihar
(74) *Attorney, Agent, or Firm* — Libby Z. Toub; Jack V. Musgrove

(57) ABSTRACT

Power, routability and electromigration have become crucial issues in modem microprocessor designs. In high performance designs, clocks are the highest consumer of power. Arranging clocking components with regularity so as to minimize the capacitance of the clock nets can help reduce clock power, however, it may hurt performance due to some loss of flexibility in physically placing those components. The present invention provides techniques to optimally design a clock network by logically assigning clusters of the latches to respective clock distribution structures, placing clock pins at favored pin locations, and placing clock distribution structures directly underneath the clock pins. The clock distribution structures may be moved to favored distribution locations along the clock stripes, and new optimal clustering generated between the latches and the clock distribution structures. These three optimizations are preferably repeated iteratively to derive a local optimal solution for the clock network.

20 Claims, 6 Drawing Sheets

REGULAR LOCAL CLOCK BUFFER PLACEMENT AND LATCH CLUSTERING BY ITERATIVE OPTIMIZATION

STATEMENT REGARDING FEDERALLY SPONSORED RESEARCH OR DEVELOPMENT

This invention was made with Government support under DARPA, HR0011-07-9-0002. THE GOVERNMENT HAS CERTAIN RIGHTS IN THIS INVENTION.

BACKGROUND OF THE INVENTION

1. Field of the Invention

The present invention generally relates to the fabrication and design of semiconductor chips and integrated circuits, and more particularly to a method of designing the physical layout (placement) of latches and other logic cells which receive clock signals from clock distribution structures such as local clock buffers.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of an integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

While current placement techniques provide adequate placement of cells with regard to their data interconnections, there is an additional challenge for the designer in constructing a clock network for the cells and this challenge is becoming more difficult in the context of modern technologies such as those used to design low-power, 65-nanometer integrated circuits. Low power circuits (e.g., around 20 watts or less for microprocessor chips) are becoming more prevalent due to power consumption problems. In particular, power dissipation has become a limiting factor for the yield of high-performance circuit designs (operating at frequencies around 1 gigahertz or more) fabricated in deep submicron technologies. Clock nets can contribute up to 50% of the total active power in multi-GHz designs. Low power designs are also preferable since they exhibit less power supply noise and provide better tolerance with regard to manufacturing variations.

There are several techniques for minimizing power while still achieving timing objectives for high performance, low power systems. One method involves the use of local clock buffers (LCBs) to distribute the clock signals. A typical clock control system has a clock generation circuit (e.g., a phase-lock loop) that generates a master clock signal which is fed to a clock distribution network that renders synchronized global clock signals at the LCBs. Each LCB adjusts the global clock duty cycle and edges to meet the requirements of respective circuit elements, e.g., local logic circuits or latches. Since this clock network is one of the largest power consumers among all of the interconnects, it is further beneficial to control the capacitive load of the LCBs, each of which is driving a set of many clock sinks. One approach for reducing the capacitive load is latch clustering, i.e., clusters of latches placed near the respective LCB of their clock domain. Latch clustering combined with LCBs can significantly reduce the total clock wire capacitance which in turn reduces overall clock power consumption. Since most of the latches are placed close to an LCB, clock skew is also reduced which helps improve the timing of the circuit.

Conventional placement with LCBs and latch clustering is illustrated in the flow chart of FIG. 1. The process begins with an initial placement based on a layout for the circuit (1). The layout can be provided by an EDA tool, or can simply be a random layout for the circuit elements. The initial placement locates all circuit elements, including clock sinks, in a region of the integrated circuit using for example quadratic placement. Other placement techniques may be used but quadratic placement often produces better results than alternatives such as min-cut based placement. The quadratic placement portion of the process solves the linear system Ax=b where A is an optimization matrix, and x and b are vectors. During quadratic placement, cells are recursively partitioned into smaller bins until a target number of objects per bin is reached, such as five objects per bin. For the initial placement, all wires (edges) have the same net-weighting. The timing of the circuit is then analyzed and adjusted in early optimization (2). This optimization may include gate re-sizing and buffer insertion using a grid system such as a 50×50 grid in which buffers are assigned to grid cells having lower logic densities. A weighted placement (3) follows which is similar to step 1, but in the weighted placement the beginning layout is the output of the early optimization step 2 and different weights are applied to different edges based on the timing constraints. The partitioning may also be finer for the weighted placement, e.g., recursively partitioning until there are around two objects per bin. The weighted placement is then followed by late optimization which provides different logic optimizations such as buffer insertion but at a finer (or sometimes the same) level, e.g., in a 100×100 grid (4). Late optimization may be the same as early optimization, the conceptual difference being that early optimization works on a circuit which is never processed by layout-driven optimization steps.

Steps 1 and 3 of FIG. 1 do not differentiate between latches and other (non-clocked) logic cells, so at first the latches are allowed to move freely according to placement tools driven by data path timing. In the following steps the process focuses on the latches only, i.e., latches that are part of one or more clock domains. Latches are grouped into a given cluster based on locality and clock domain, and the LCB for a given clock domain is located at the centroid of the latch clusters and the latches are pulled to the LCB (5). For this latch-LCB driven placement, the size of the LCBs is temporarily shrunk to the same width as a latch. A relatively high weighting (attraction) is applied to the interconnections between the latch and the LCB for this placement step, e.g., by a factor of 10 compared to the net weights of the most critical data paths. In this manner all latches will be placed next to the corresponding LCB, which is then readjusted back to its original size. Further placement and optimization may be performed with the locations of the LCBs and latches fixed (6). The final step is detailed placement and optimization which refines the layout using for example min-cut placement or heuristic techniques (7).

The resulting LCB-latch structure can be very large relative to other circuit elements involved in the placement process, and greatly impacts the timing of the circuit. Unfortunately, the large macro synthesis flow may introduce additional constraints such as fixed clock pin locations which further limits the ability to optimize a design. It would, therefore, be desirable to devise an improved optimization method which could simultaneously determine the locations of clock pins, latch clustering and LCB placement while still minimizing distortion of the input layout. It would be further advantageous if the method could improve power consumption while reducing clock skew.

SUMMARY OF THE INVENTION

It is therefore one object of the present invention to provide an improved placement method which provides more flexibility in the location of clock components.

It is another object of the present invention to provide such a method which improves clock power while reducing clock skew.

It is yet another object of the present invention to provide such a method which better utilizes local clock buffer latch drive strength.

The foregoing objects are achieved in a method for designing the layout of a plurality of latches in one or more clock domains of an integrated circuit by receiving an input layout of the latches, logically assigning clusters of the latches to respective clock distribution structures, placing clock pins at favored pin locations, placing the clock distribution structures underneath the clock pins such that at least a portion of a given clock distribution structures overlaps with its corresponding clock pin, and connecting each clock distribution structure to its corresponding cluster of latches. The goal of this optimization procedure may for example be chosen to minimize latch distortion from the input layout. In the illustrative implementation vertical clock stripes are further defined for the clock pins, the clock distribution structures are placed at distributed locations along the clock stripes, and optimal clustering is generated between the latches and the clock distribution structures. The placement of the clock pins, the placement of the clock distribution structures, and the generation of optimal clustering are preferably repeated iteratively and alternating to derive a local optimal solution for the clock network. The entire iterative procedure may further be repeated in multiple trials which start with different initial solutions, and a final solution is selected from multiple local optimum solutions.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED
EMBODIMENT(S)

Figure 1:
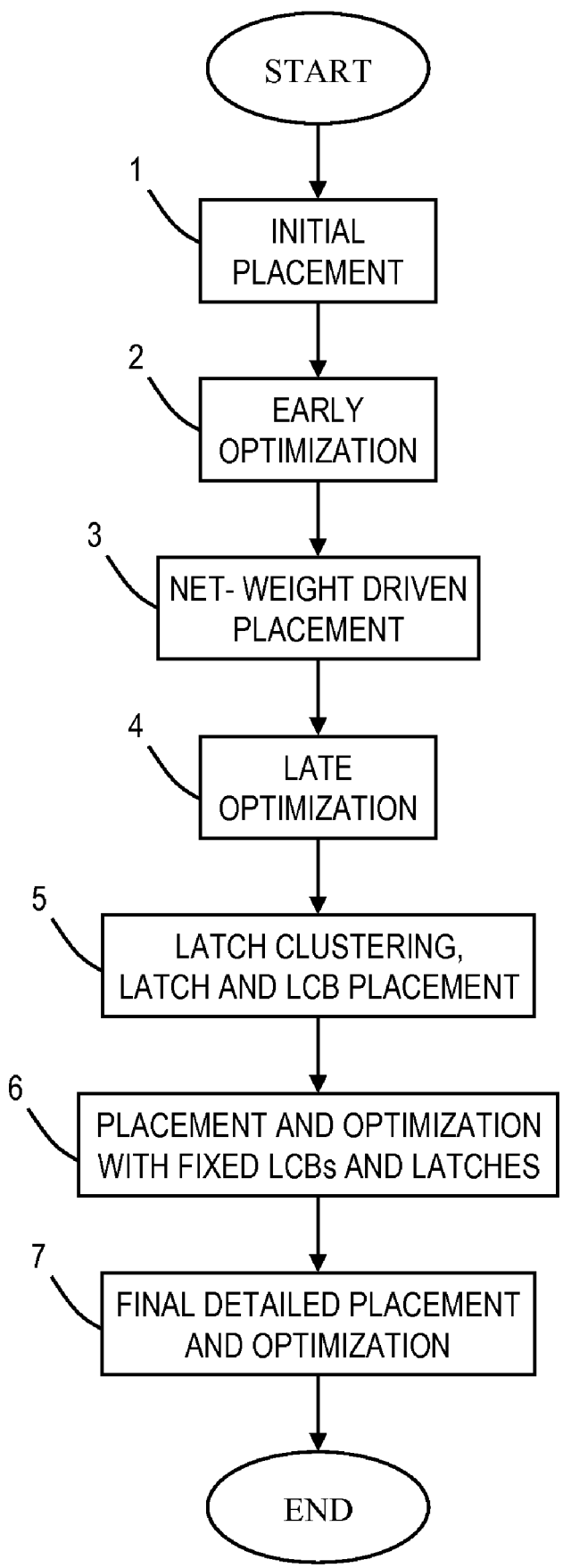
FIG. 1 is a chart illustrating the logical flow for a conventional latch placement technique with clock optimization followed by latch-LCB driven placement.
Figure 2:
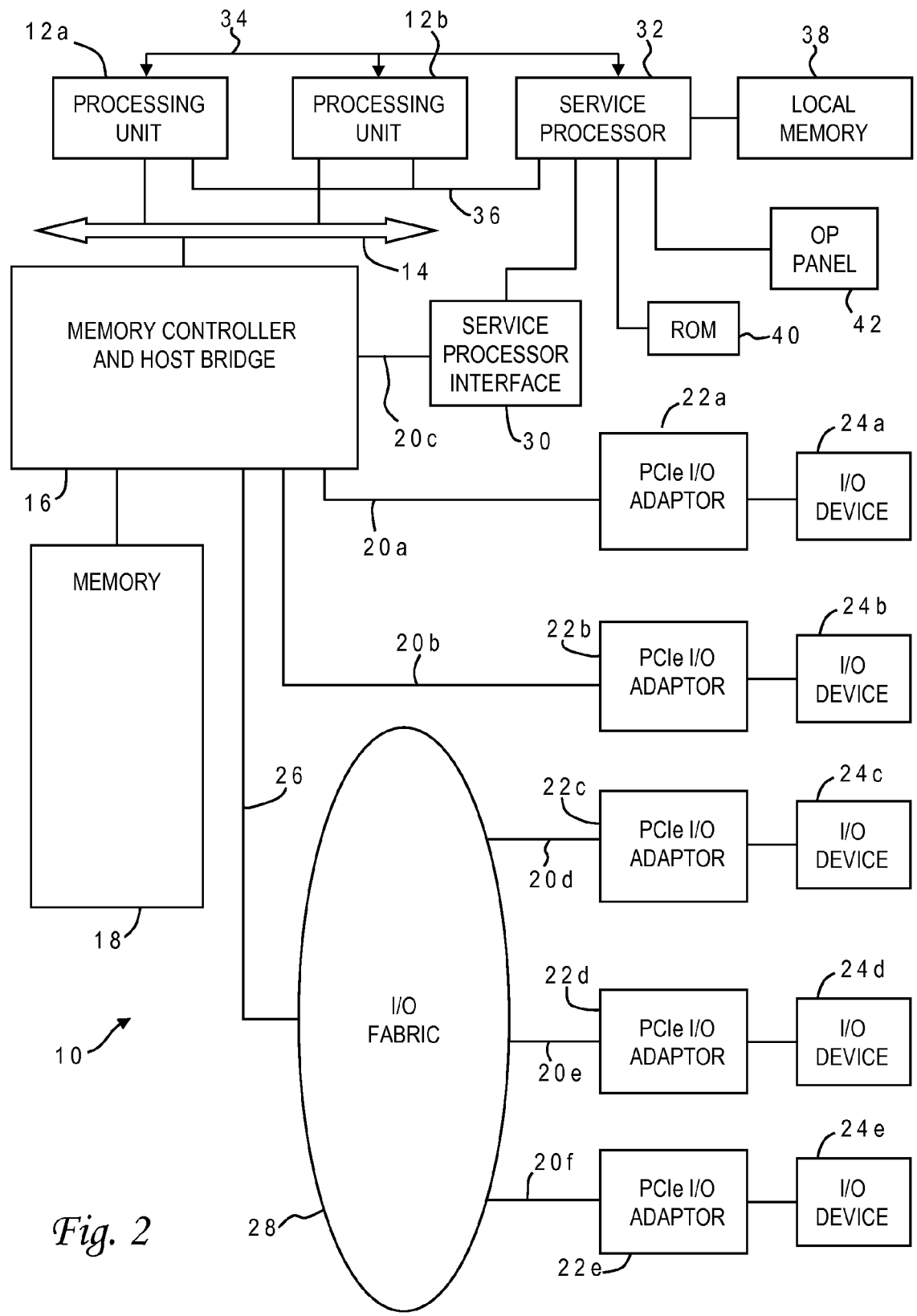
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system in which the present invention may be implemented. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe)link 20a, 20b is connected to a respective PCIe adaptor 22a, 22b, and each PCIe adaptor 22a, 22b is connected to a respective input/output (I/O) device 24a, 24b.

MC/HB 16 may additionally have an interface to an I/O bus 26 which is connected to a switch (I/O fabric) 28. Switch 28 provides a fan-out for the I/O bus to a plurality of PCI links 20*d*, 20*e*, 20*f*. These PCI links are connected to more PCIe adaptors 22*c*, 22*d*, 22*e* which in turn support more I/O devices 24*c*, 24*d*, 24*e*. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12*a*, 12*b* may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20*c* connects MC/HB 16 to a service processor interface 30 to allow communications between I/O device 24*a* and a service processor 32. Service processor 32 is connected to processors 12*a*, 12*b* via a JTAG interface 34, and uses an attention line 36 which interrupts the operation of processors 12*a*, 12*b*. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12*a*, 12*b* and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12*a*, 12*b* for execution of the program code, e.g., an operating system (OS) which is used to launch applications and in particular the circuit design application of the present invention, results of which may be stored in a hard disk drive (I/O device 24).

While the illustrative implementation provides program instructions embodying the present invention on the hard disk, those skilled in the art will appreciate that the invention can be embodied in a program product utilizing other computer-readable storage media, excluding transitory media such as propagating signals. The program instructions may be written using the C++ programming language for an AIX environment. Computer system 10 carries out program instructions for placement of clock sinks and clock distribution structures (e.g., local clock buffers) in the design of an integrated circuit using a novel technique wherein the sinks are preferably initially placed and optimized by conventional methods and thereafter are iteratively optimized as explained further below. Accordingly, a program embodying the invention may include conventional aspects of various quadratic optimizers, cut-based partitioners, buffer insertion tools, etc. and these details will become apparent to those skilled in the art upon reference to this disclosure. Although these clock sinks are referred to herein as latches, these terms includes devices such as flip-flops, dynamic logic circuits, or any combination of these and other clocked circuit elements. The integrated circuit designed in accordance with the present invention may for example be a random logic module (macro).

Figure 3:
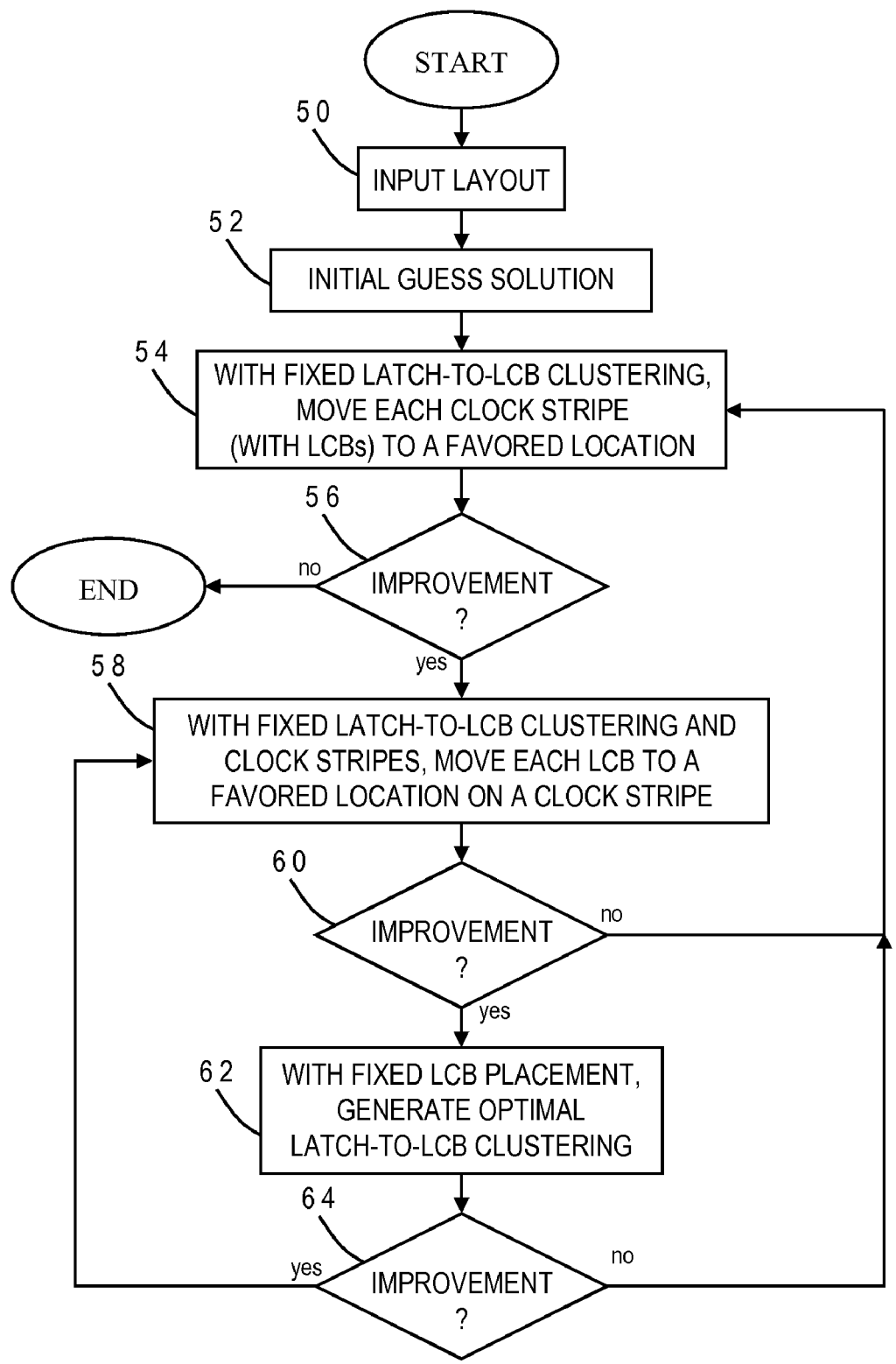
FIG. 3 is a chart illustrating the logical flow for regular placement of clock repeater components with iterative optimization according to one implementation of the present invention.

The present invention may be further understood with reference to the chart of FIG. 3 which illustrates the logical flow according to one implementation of the present invention. The invention begins when computer system 10 receives input data in the form of a netlist or other circuit description with a source and multiple sinks for each clock domain together with other logic cells of the circuit, as well as the clock domain information (50). Prior to initial placement the design may be clock traced to assign latches to their respective domain groups. In this regard, the term "clock domain" generally refers to any non-data signal that is used to gate one or more sinks. The input layout may also include gating source information for the domain group. A starting layout of the sinks can be provided by an EDA tool.

An initial guess solution is then applied to the input layout (52). The initial guess solution may include arbitrary latch-to-LCB clustering, placing clock pins at arbitrary locations, and LCB placement under the clock pins such that at least a portion of a given LCB overlaps with its corresponding clock pin. The clock pins can be designated as vertical clock stripes with a minimum length requirement to allow for design tolerances. The process then moves each clock pin or stripe, together with the LCBs placed under it, to a favored location while keeping the latch-to-LCB clustering fixed (54). A determination is then made as to whether the resulting layout is an improvement over previous iterations (56). If there is no improvement, the process ends. If there is an improvement (or for the first iteration) the process continues by moving each LCB to a favored location under either its currently aligned clock stripe or a different one while keeping the latch-to-LCB clustering and clock stripes fixed (58). This LCB location may result in the reassignment of an LCB from one clock stripe to another. Another determination is made as to whether the resulting layout is an improvement over the previous version (60). If there is no improvement, the process repeats iteratively at step 54. If there is an improvement, new optimal latch-to-LCB connections are generated while keeping the location of the LCBs fixed (62). Another determination is made as to whether the resulting layout is an improvement over the previous layout (64). If there is no improvement, the process again repeats iteratively at step 54. If there is an improvement, the process instead repeats iteratively at step 58.

The iterative and alternating placement according to FIG. 3 finds a local optimal solution for three degrees of freedom, i.e., the clock stripes, latch-to-LCB clustering, and LCB location. This implementation is an adaptation of the iterative heuristic known as the "Lloyd Method I" from the field of digital communication. The convergence of the heuristic is guaranteed due to the monotonically decreasing cost function (e.g., total distortion) and the discrete nature of the latch clustering problem. However, the ordering and nesting of the three optimization steps 54, 58 and 62 are not limited to that shown in FIG. 3. Alternative algorithms may be employed which iterate among these optimizations in different orders, with different branching, or with only two of the optimizations. Furthermore while the iterative aspect of this implementation is useful in deriving the local optimal solution, those skilled in the art will appreciate that the invention provides an improved solution over the prior art by allowing movement of the clock pins even without iteration.

Additional enhancement of the present invention can be achieved by repeating the iterative procedure with multiple trials having different initial guess solutions to explore a larger search space. The resulting final solution selected from different local solutions is more likely to be the global optimum.

The specific details for each of the optimizations depend on the formulation of the cost function to be minimized. For example, when the total absolute value of latch distortion is to be minimized (measured by the sum of the latch-to-LCB distances, which approximate the sum of the latch move-distances), step 54 will place a clock stripe at the median x-coordinate of the latches assigned to it. Alternatively, when the total square of latch distortion is to be minimized, a clock stripe is placed at the x-coordinate of the center of gravity of the latches. Each latch may further be weighted by its timing criticality, and the distortion associated with its movement is weighted accordingly. These same metrics may be used for the other optimizations, or different metrics may be used for different optimizations. The costs functions also provide the bases for the automated method to determine whether a new layout is an improvement over a previous layout.

Figure 4A:
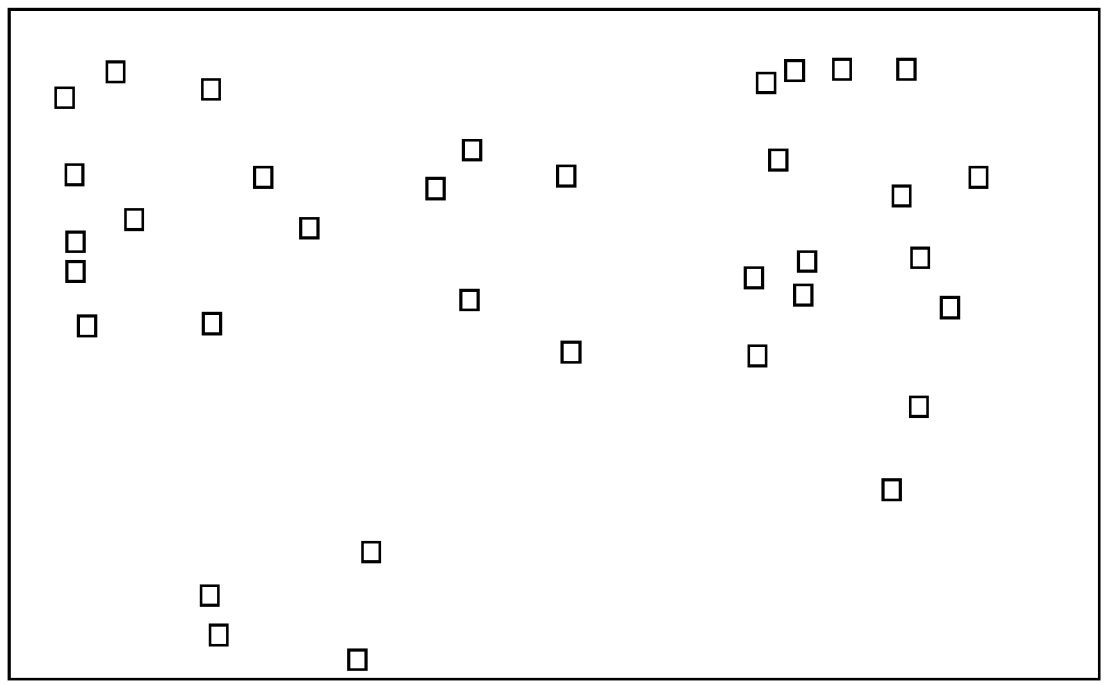
FIGS. 4A-4F are plan views for layouts of an integrated circuit which start with an input layout of latches in one or more clock domains, and subsequent placement of local clock buffers and clock stripes in accordance with one implementation of the present invention.
Figure 4B:
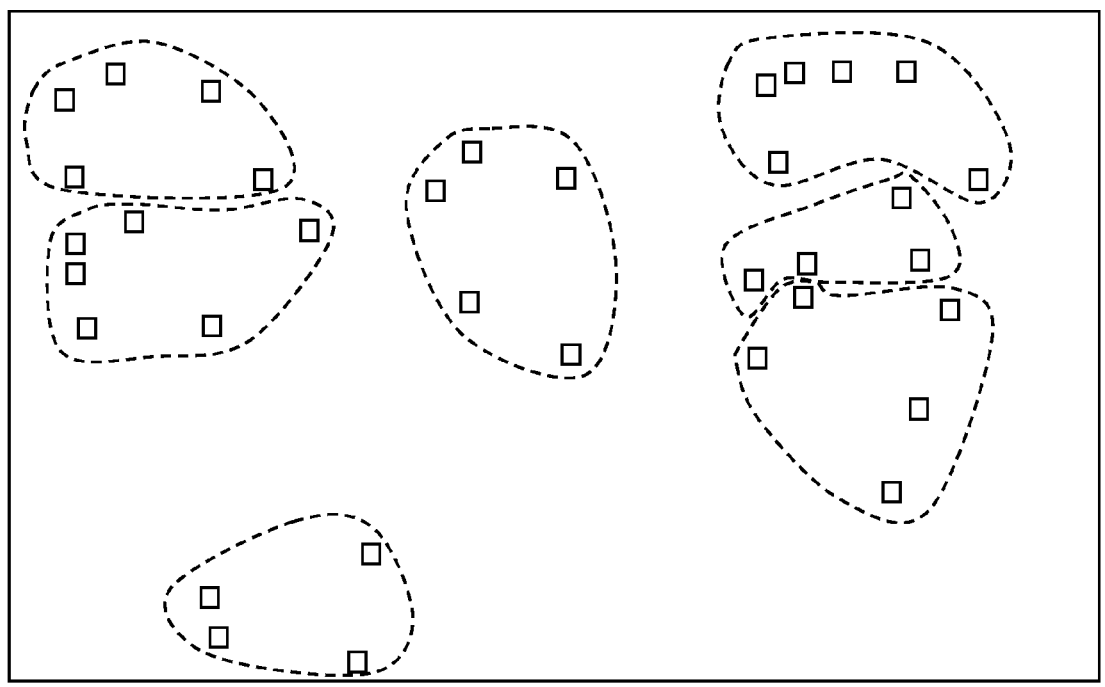
Figure 4C:
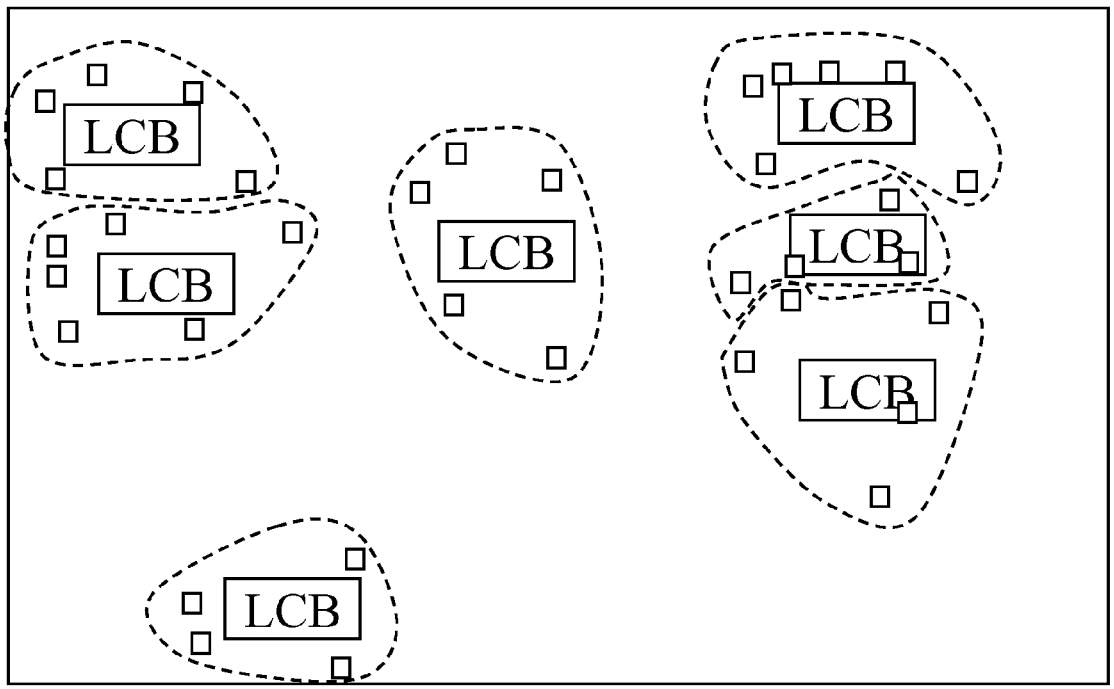
Figure 4D:
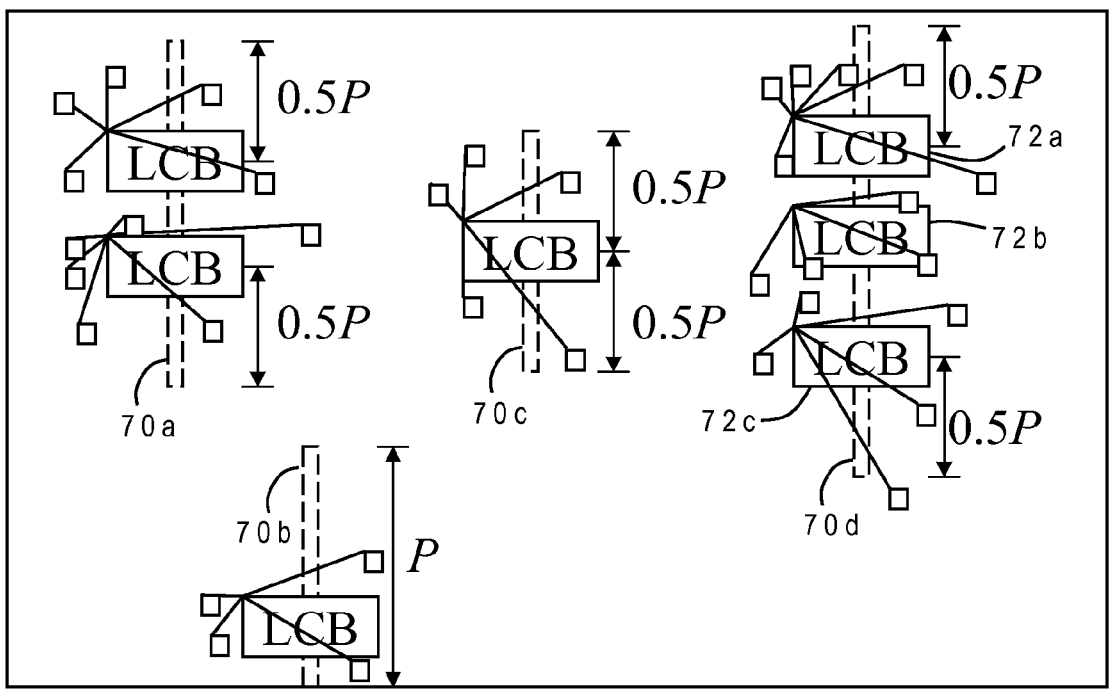
Figure 4E:
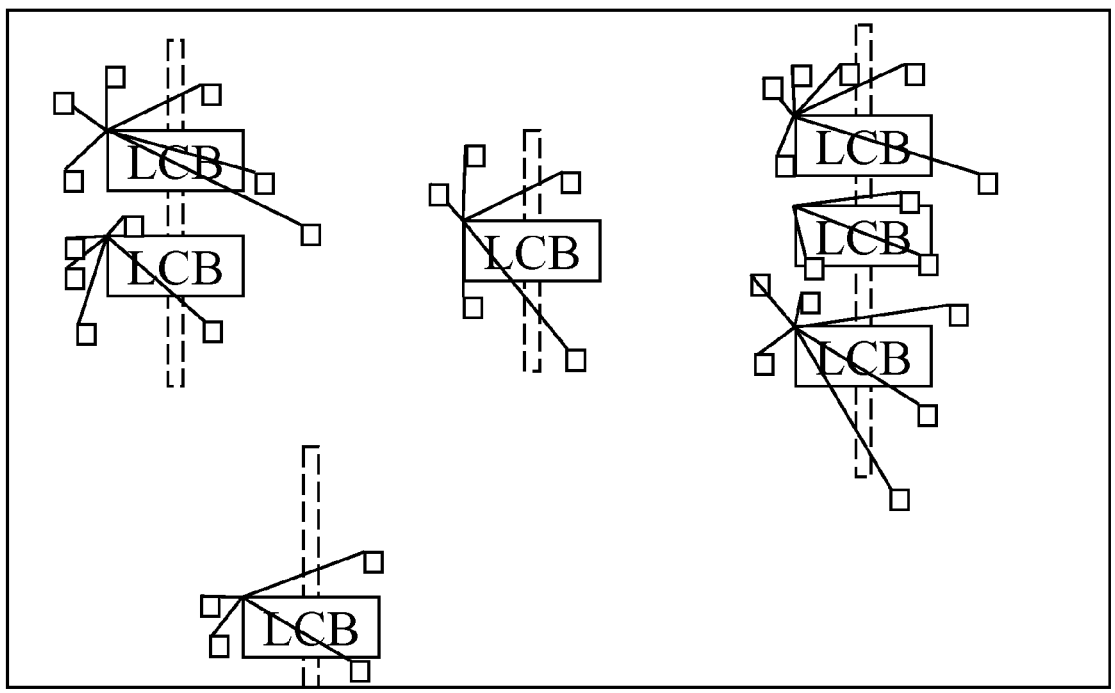
Figure 4F:
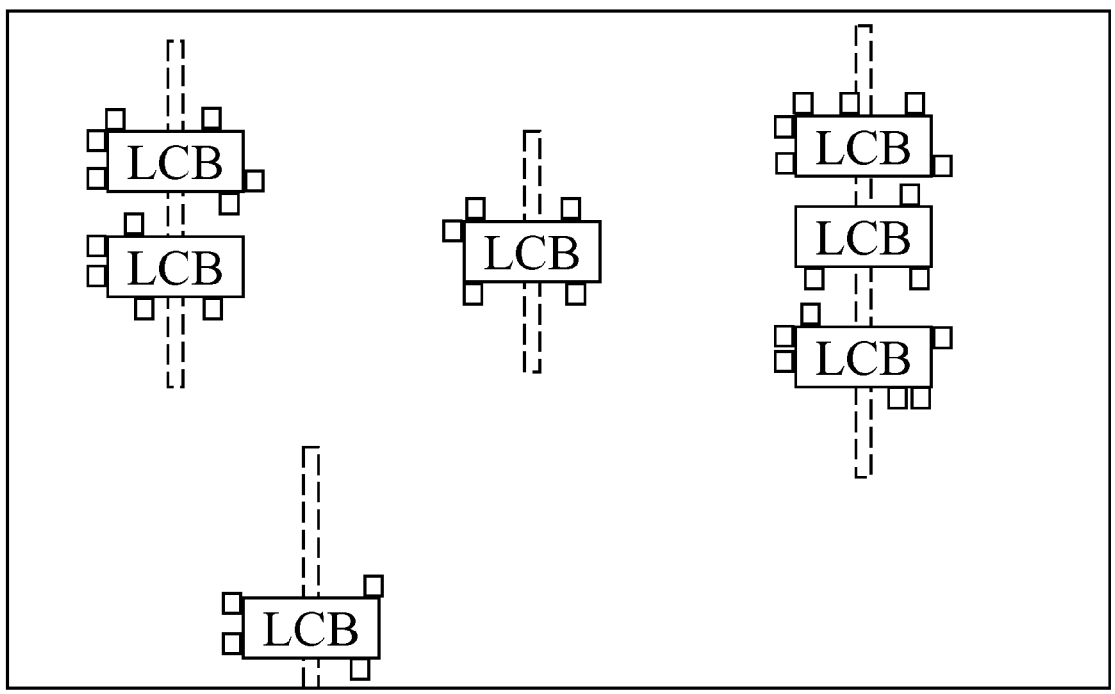

FIGS. 4A-4F illustrate different stages of a design in an exemplary implementation of the present invention. FIG. 4A shows only the latches for an input layout of an integrated circuit that may be derived using EDA tools as discussed above, prior to generation of the clock network. In FIG. 4B the latches have been grouped into several clusters as indicated by the dashed lines. An LCB is logically assigned to each cluster in FIG. 4C. In FIG. 4D, clock stripes (metal reservations) 70a, 70b, 70c, 70d have been placed at favored locations based on the clustered latches, and the LCBs have been moved to favored locations on the clock stripes per the aforementioned cost functions. Some of the LCBs may be aligned, such as LCBs 72a, 72b, and 72c which form a column. For design tolerance purposes, each clock stripe has a total length of at least P and each stripe extends past an LCB on one side (top or bottom) by at least ½ P; in the preferred implementation P is on the order of 100 μm. FIG. 4E is similar to FIG. 4D but two latches have been reassigned to different LCBs for optimal latch-to-LCB clustering based on the newly optimized locations of the LCBs. FIG. 4F represents detailed placement using the latch-to-LCB clustering of FIG. 4E, wherein latches are pulled adjacent to the corresponding LCB to minimize overall latch-to-LCB distance.

In the resulting circuit macro design, since each clock buffer is placed underneath a macro clock input pin and the latches driven by this clock buffer are placed closely surrounding it, there is near-zero wire capacitance between clock buffers and macro clock pins, and clock signals arrive at each latch at nearly the same time. The placement of clock buffers on pins thus improves clock power while reducing clock skew, reducing clock latency, and controlling the electromigration effect, and the ability to move the vertical clock stripes for placing the buffers imparts further flexibility to the optimization process. This optimization also includes consideration of the preferred sink locations and does require that they be moved long distances. The present invention thereby provides more design predictability and greater utilization of the maximum LCB latch drive strength.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. In the simplified example of FIG. 4, there are 35 latches and 7 LCBs in a single clock domain but those skilled in the art will appreciate that practical applications of the invention may involve hundreds or thousands of clock sinks with larger numbers of latch-LCB clusters and additional clock domains. It is therefore contemplated that such modifications can be made without departing from the spirit or scope of the present invention as defined in the appended claims.

What is claimed is:

1. A computer-implemented method of designing a clock network for a plurality of latches in one or more clock domains of an integrated circuit, comprising:
   receiving an input layout of the latches by executing first program instructions in a computer system;
   logically assigning clusters of the latches to respective clock distribution structures by executing second program instructions in the computer system;
   placing clock pins at pin locations by executing third program instructions in the computer system;
   placing the clock distribution structures underneath the clock pins such that at least a portion of a given clock distribution structure overlaps with a corresponding clock pin by executing fourth program instructions in the computer system; and
   connecting each clock distribution structure to a corresponding cluster of the latches by executing fifth program instructions in the computer system.

2. The method of claim 1 wherein the pin locations are chosen to minimize latch distortion from the input layout.

3. The method of claim 1 wherein two or more of the clock distribution structures are aligned to form a column.

4. The method of claim 1, further comprising:
   defining vertical clock stripes for the clock pins by executing sixth program instructions in the computer system;
   placing the clock distribution structures at distributed locations along the clock stripes by executing seventh program instructions in the computer system; and
   generating optimal clustering between the latches and the clock distribution structures by executing eighth program instructions in the computer system.

5. The method of claim 4 wherein said placing of the clock pins, said placing of the clock distribution structures, and said generating of the optimal clustering are iteratively repeated to derive a local optimal solution for the clock network.

6. A computer system comprising:
   one or more processors which process program instructions;
   a memory device connected to said one or more processors; and
   program instructions residing in said memory device for designing a clock network for a plurality of latches in one or more clock domains of an integrated circuit, by receiving an input layout of the latches, logically assigning clusters of the latches to respective clock distribution structures, placing clock pins at pin locations, placing the clock distribution structures underneath the clock pins such that at least a portion of a given clock distribution structure overlaps with a corresponding clock pin, and connecting each clock distribution structure to a corresponding cluster of the latches.

7. The computer system of claim 6 wherein the pin locations are chosen to minimize latch distortion from the input layout.

8. The computer system of claim 6 wherein two or more of the clock distribution structures are aligned to form a column.

9. The computer system of claim 6 wherein said program instructions further design the clock network by:
   defining vertical clock stripes for the clock pins;
   placing the clock distribution structures at distributed locations along the clock stripes; and
   generating optimal clustering between the latches and the clock distribution structures.

10. The computer system of claim 9 wherein said program instructions iteratively repeat the placing of the clock pins, the placing of the clock distribution structures, and the generating of the optimal clustering to derive a local optimal solution for the clock network.

11. A computer program product comprising:
    a computer-readable storage medium; and
    program instructions residing in said storage medium for designing a clock network for a plurality of latches in one or more clock domains of an integrated circuit, by receiving an input layout of the latches, logically assigning clusters of the latches to respective clock distribution structure, placing clock pins at pin locations, placing the clock distribution structures underneath the clock pins such that at least a portion of a given clock distribution structure overlaps with a corresponding clock pin, and connecting each clock distribution structure to a corresponding cluster of the latches.

12. The computer program product of claim 11 wherein the pin locations are chosen to minimize latch distortion from the input layout.

13. The computer program product of claim 11 wherein two or more of the clock distribution structures are aligned to form a column.

14. The computer program product of claim 11 wherein said program instructions further design the clock network by:
    defining vertical clock stripes for the clock pins;
    placing the clock distribution structures at distributed locations along the clock stripes; and
    generating optimal clustering between the latches and the clock distribution structures.

15. The computer program product of claim 14 wherein said program instructions iteratively repeat the placing of the clock pins, the placing of the clock distribution structures, and the generating of the optimal clustering to derive a local optimal solution for the clock network.

16. A computer-implemented method of designing a clock network for a plurality of latches in one or more clock domains of an integrated circuit, comprising:
    receiving an input layout of the latches by executing first program instructions in the computer system;
    logically assigning clusters of the latches to respective clock distribution structures by executing second program instructions in the computer system;
    placing clock pins at favored pin locations, the clock pins having vertical clock stripes by executing third program instructions in the computer system;
    placing the clock distribution structures at favored distribution locations along the clock stripes such that at least a portion of a given clock distribution structure overlaps with a corresponding clock stripe by executing fourth program instructions in the computer system;
    generating optimal clustering between the latches and the clock distribution structures by executing fifth program instructions in the computer system; and
    iteratively repeating said placing of the clock pins, said placing of the clock distribution structures, and said generating of the optimal clustering to derive a local optimal solution for the clock network by executing sixth program instructions in the computer system.

17. The method of claim 16 wherein the favored pin locations are at median x-coordinates of the latch clusters.

18. The method of claim 16 wherein the favored pin locations are at centers of gravity of the latch clusters.

19. The method of claim 16 wherein said iteratively repeating nests said placing of the clock distribution structures and said generating of the optimal clustering within iterations of said placing of the clock pins.

20. The method of claim 16 further comprising:
    repeating said assigning using different initial solutions and thereafter iteratively repeating said moving of the clock pins, said moving of the clock distribution structures, and said generating of the optimal clustering to derive multiple local optimum solutions by executing seventh program instructions in the computer system; and
    selecting one of the local optimum solutions as a final solution for the clock network by executing eighth program instructions in the computer system.

* * * * *